(12) United States Patent
Jansen

(10) Patent No.: US 7,801,195 B2
(45) Date of Patent: Sep. 21, 2010

(54) ELECTRICALLY-PUMPED SEMICONDUCTOR ZIGZAG EXTENDED CAVITY SURFACE EMITTING LASERS AND SUPERLUMINESCENT LEDS

(75) Inventor: Michael Jansen, Palo Alto, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 0 days.

(21) Appl. No.: 12/371,497

(22) Filed: Feb. 13, 2009

(65) Prior Publication Data

US 2009/0207873 A1 Aug. 20, 2009

Related U.S. Application Data

(60) Provisional application No. 61/065,817, filed on Feb. 14, 2008.

(51) Int. Cl.
*H01S 5/00* (2006.01)
(52) U.S. Cl. ............. 372/50.11; 372/50.12; 372/50.124
(58) Field of Classification Search ............... 372/50.11, 372/50.12, 50.124
See application file for complete search history.

(56) References Cited

U.S. PATENT DOCUMENTS

| | | | |
|---|---|---|---|
| 5,131,002 | A | 7/1992 | Mooradian |
| 6,404,797 | B1 | 6/2002 | Mooradian |
| 6,778,582 | B1 | 8/2004 | Mooradian |
| 6,898,225 | B2 | 5/2005 | Mooradian |
| 7,189,589 | B2 | 3/2007 | Carey et al. |
| 7,322,704 | B2 | 1/2008 | Shchegrov |
| 2003/0012246 | A1 | 1/2003 | Klimek et al. |
| 2006/0176544 | A1 | 8/2006 | Wasserbauer |
| 2006/0251141 | A1 | 11/2006 | Mefferd et al. |
| 2008/0175289 | A1 | 7/2008 | Tiberi et al. |

FOREIGN PATENT DOCUMENTS

| | | |
|---|---|---|
| WO | WO 2007/144471 A1 | 12/2007 |
| WO | 2009/034269 | 9/2009 |

OTHER PUBLICATIONS

Comaskey, B., et al., "High Average Power Diode Pumped Slab Laser," *IEEE Journal*, vol. 28 No. 4, Apr. 1992, pp. 992-996.
Farinas, A, et al., "Design and Characterization of a 5.5-W, cw, Injection-Locked, Fiber-Coupled, Laser-Diode-Pumped Nd:YAG Miniature-Slab Laser," *Optics Letters*, vol. 19, No. 2, Jan. 1994, pp. 114-116.

(Continued)

*Primary Examiner*—Armando Rodriguez

(57) ABSTRACT

A semiconductor surface emitting optical amplifier chip utilizes a zigzag optical path within an optical amplifier chip. The zigzag optical path couples two or more gain elements. Each individual gain element has a circular aperture and includes a gain region and at least one distributed Bragg reflector. In one implementation the optical amplifier chip includes at least two gain elements that are spaced apart and have a fill factor no greater than 0.5. As a result the total optical gain may be increased. The optical amplifier chip may be operated as a superluminescent LED. Alternately, the optical amplifier chip may be used with external optical elements to form an extended cavity laser. Individual gain elements may be operated in a reverse biased mode to support gain-switching or mode-locking.

21 Claims, 10 Drawing Sheets

OTHER PUBLICATIONS

Kane, T.J., et al., "Reduced Thermal Focusing and Birefringence in Zig-Zag Slab Geometry Crystalline Lasers," *IEEE Journal*, vol. QE-19, No. 9, Sep. 1983, pp. 1351-1354.

Koechner, W., "Solid-State Laser Engineering," Springer-Verlag New York Heidelberg Berlin, 1976, 7 pages.

Mandl, A., et al., "Energy Scaling and Beam Quality Studies of a Zigzag Solid-State Plastic Dye Laser," *IEEE Journal*, vol. 32, No. 10, Oct. 1996, pp. 1723-1726.

ELECTRICALLY-PUMPED SEMICONDUCTOR ZIGZAG EXTENDED CAVITY SURFACE EMITTING LASERS AND SUPERLUMINESCENT LEDS

CROSS-REFERENCE TO RELATED APPLICATIONS

This application claims the benefit of U.S. provisional patent application No. 61/065,817 filed on Feb. 14, 2008 which application is hereby incorporated by reference in its entirety.

FIELD OF THE INVENTION

The present invention is generally related to semiconductor surface emitting lasers. More particularly the present invention is directed towards improving the performance of extended cavity surface emitting semiconductor laser structures by using a zigzag configuration.

BACKGROUND OF THE INVENTION

Optically pumped solid state Nd:YAG slab lasers are an important class of solid state lasers. One type of Nd:YAG slab laser is a zigzag slab geometry, illustrated in FIG. 1. In the zigzag slab geometry the Nd:YAG slab has a rectangular cross-section. The slab includes tilted facets to permit a laser beam to enter and exit the slab. The slab has two large opposing faces. As illustrated in prior art FIG. 1, the slab is optically pumped by illuminating it throughout its entire length through the opposing faces. The angle of the tilted facets results in the beam entering the slab an angle (due to Snell's law) and then experiencing total internal reflection at the opposing faces. By proper selection of the angle of the titled facets and other design factors the beam zigzags down the length of the slab due to total internal reflection. That is, the optical beam experiences a sequence of internal reflections such that it has an alternating path along the length of the slab in which the beam bounces back and forth between the two large opposing faces. Additional retro-reflectors are provided to provide feedback to the slab laser. Background information on the traditional zigzag solid state laser geometry is described in W. Koechner, Solid State Laser Engineering, Springer Verlag Ed., 1976, p. 392-394, B. J. Comaskey et. al., "High average power diode pumped slab laser", IEEE J. Quantum Electronics, vol. 28, no 4, April 1992, p. 992, and A. D. Farinas et. al., "Design and characterization of a 5.5-W, cw, injection-locked, fiber-coupled, laser-diode-pumped Nd:YAG miniature-slab laser. Optics Letters, vol 19, no. 2, Jan. 15, 1994, p. 114, the contents of which are hereby incorporated by reference.

One aspect of a conventional Nd:YAG slab zigzag laser is that it is optically pumped throughout the entire body of the slab. Thus, the beam, experiences optical gain along the entire length that it traverses the slab. Additionally, a conventional Nd:YAG zigzag slab laser benefits from the comparatively small gain spectrum and comparatively small variation in refractive index characteristics of solid state lasers. As a result, a conventional Nd:YAG slab laser can be used to provide a high quality laser output.

In contrast, a zigzag laser geometry has previously proven impractical for implementing an efficient, high power semiconductor laser with desirable optical mode characteristics. Semiconductor lasers have a comparatively broad gain spectrum, higher gain coefficients, and a high sensitivity of refractive index to temperature and pumping level. It is difficult to achieve high power output from large area and volumes of gain material without creating various optical instabilities in the spatial and longitudinal modes. For example, it is well known that a slab-geometry semiconductor laser pumped over a large width has a tendency to lase in multiple lateral modes. That is, special efforts are often required to suppress parasitic lasing in slab-geometry semiconductor lasers and amplifiers because of the large gain in typical semiconductors. For example, lateral lasing can occur in high fill factor laser bars unless deep isolation trenches are etched between the emitter stripes to circumvent it. As a result, because of the large gain in typical semiconductor materials, the design to suppress parasitic lasing is a common issue. There are also practical difficulties in modulating a large area semiconductor laser due to their large capacitance (large RC time constant), the requirement for high modulation currents and the generation of various modal instabilities.

There are several semiconductor zigzag lasers that have been proposed in the prior art. However, each of them has significant shortcomings that make them unusable as a practical alternative to other types of semiconductor lasers.

One approach to implementing a zigzag semiconductor laser is disclosed in U.S. Pat. Pub. 2003/0012246 by Klimek, "Semiconductor ZigZag Laser and Optical Amplifier." However, the numerous deficiencies in Klimek make the design unusable for achieving an efficient, electrically pumped laser with a stable large-area optical mode. The epitaxial layer design approach disclosed in U.S. Pat. Pub. 2003/0012246 is extremely close in design to conventional solid state slab lasers. The semiconductor structure includes an active region sandwiched between two cladding layers, similar to a conventional edge-emitting semiconductor laser. The active region includes p-doped and n-doped regions. Klimek describes both optical pumping and electrical pumping but does not disclose a practical means to provide efficient electrical pumping. The embodiment with electrical pumping would be understood to require p-doping in one of the cladding layers and n-doping in the other cladding layer in order to form a p-n laser diode between the top and bottom electrical contacts. Thus, in electrically pumped embodiments of Klimek the optical mode traverses a zigzag path through both n and p doped active regions and n and p doped cladding regions, resulting in significant optical loss. Moreover, the zigzag path has a sequence of nodes and antinodes along the active region. As a result gain is not utilized effectively.

Additionally, there are also several other practical problems with the electrically pumped embodiments disclosed in Klimek. Klimek discloses that the optical cladding layers are epitaxially grown. However, there are practical limits to the thickness with which doped cladding layers can be grown with a high optical and material quality and with a reasonably low electrical resistance consistent with an efficient design. In comparable edge-emitting laser structures the cladding regions are typically only a few microns in thickness to reduce electrical resistance and to minimize undesirable optical losses in doped layers. However, if such an efficient laser structure was used in Klimek it would limit the vertical mode to a few microns in dimension, i.e., to a dimension consistent with bouncing the mode within a laser structure having cladding layers of only a few microns in thickness. Thus, an efficient electrically pumped implementation of Klimek would have a small spot size in at least one dimension because of limitations on the cladding thicknesses. Klimek also does not disclose a practical means to couple light into and out of the semiconductor chip. While Klimek discloses one embodiment with angled facets, such angled facets are difficult to fabricate with controlled angles in most semiconductors. In particular, the natural cleavage and etching planes of most semiconductors do not occur at the same angles required for a slab laser. Another embodiment in Klimek utilizes micro-prism elements to couple light to the semiconductor chip. However, such micro-prisms would be difficult to implement on such a small physical scale and would require additional alignment and packaging steps that are undesirable. Additionally, Klimek teaches that the slab has a large lateral size. However, this will tend to result in the generation of multiple lateral modes in the laser, similar to that observed in large area edge-emitting lasers, or as one extreme would result in parasitic lateral lasing. No teaching is provided in Klimek regarding how parasitic lasing would be suppressed. Klimek also does not provide guidelines for practical dimensions of its proposed structures and offers no solutions for dissipating and removing heat from the laser and for addressing stresses in the epitaxial structure. Klimek also has other deficiencies, including non-operative examples in which the stated materials would not have the correct indices of refraction to provide total internal reflection.

Another approach to implementing a semiconductor laser having a zigzag-like path is described in U.S. Pat. No. 5,131, 002 by Aram Mooradian entitled "Optically-pumped external cavity laser" (hereinafter "The Mooradian patent"). The Mooradian patent discloses optically pumping a semiconductor material in a series of active regions of a semiconductor wafer using an array of optical pump sources. Each active region includes an active semiconductor laser material, such as GaAs, that is sandwiched between cladding layers of AlGaAs. The epitaxial structure is described as having a thickness of a few microns or tens of microns. The Mooradian patent does not, however, utilize total internal reflection. Instead, the zigzag path is generated by utilizing two additional mirrors. A bottom mirror is formed on the bottom of the substrate. Thus, the optical mode in Mooradian must traverse all of the semiconductor layers and the substrate in order to reflect off the bottom mirror. A second (top) mirror is positioned above the wafer. No description is provided in the Mooradian patent how the active regions would be electrically pumped. Moreover, the Mooradian patent is also silent regarding various other details necessary to make an efficient laser with a stable optical beam. Some of the deficiencies of the Mooradian patent are described in U.S. Pat. Pub. No. 2006/0251141 by Mefferd et al., which describes in paragraphs [0008]-[0009] that the Mooradian patent suffers from deficiencies such as problems in cooling an extended pumped area, potential misalignment due to changes in flatness over the chip, and the need to vary the areas of the active regions by up to a factor of four to achieve an efficient resonator. U.S. Pat. Pub. No. 2006/0251141 in fact proposes using a complex structure having multiple separate chips and external fold mirrors to solve these problems.

U.S. Pat. Pub. No. 2006/0176544 by Wasserbauer discloses an optical amplifier structure in which light travels in a zigzag path along the length of the optical amplifier. The optical amplifier is described as being uniformly pumped and provided with a transverse waveguide, such as a ridge waveguide. The active region in sandwiched between top and bottom distributed Bragg reflector mirrors. The optical beam enters the amplifier and strikes the bottom reflector, passes through the gain region, bounces off the top mirror, and then is directed down to the bottom mirror and so on until the optical mode has traveled through the entire length of the amplifier. However, this amplifier design has various shortcomings. First, the use of optical gain is potentially inefficient, as the entire amplifier is pumped whereas the zigzag path will result in a sequence of nodes and antinodes along the gain region due to the zigzag path. Second, the spot size will be limited to a comparatively small spot size. In the lateral dimension the spot size will be limited by the transverse lateral guide to dimensions of about a few microns or so. Second, in the vertical dimension the spot size will also be limited to a few microns or so, consistent with the thickness of the epitaxial mirrors. In light of these various considerations, the amplifier cannot be used as the basis of an efficient, high-power laser with a large spot size.

Thus, while the prior art suggests a long-felt need for a zigzag-type semiconductor laser with desirable beam characteristics this objective has not been met. The solutions proposed in the prior art are not consistent with achieving an electrically pumped semiconductor laser that is efficient, capable of high power output, which has a large spot size and which can be effectively used in a gain-switched or mode-locked configuration.

SUMMARY OF THE INVENTION

In accordance with one embodiment a set of distributed and scalable set of semiconductor gain elements is formed on a common substrate and is electrically pumped, wherein each gain element provides amplification. Each gain element can be of the regenerative type. A light beam enters and exits a gain element at a non-normal angle of incidence (i.e. a zigzag optical path). Without mirrors or with only one reflective element the structure can be used to achieve high power amplified superluminescent emission.

When mirrors or reflective surfaces are positioned at both ends of the optical beam path, they form a laser resonator for the electrically-pumped zigzag semiconductor laser. Electrically, the laser can be made with single-sided or double-sided contacts. The laser can be a stand-alone laser, a master-oscillator power amplifier (MOPA) and can be made to operate in single longitudinal mode by adding grating elements or etalons in the cavity.

Single-sided lasers can be gain-switched or mode-locked by reversing the electrical polarity on one or more of the gain elements and introducing a loss in the laser cavity. The structure is general in nature and can be implemented in a wide number of semiconductor material configurations, thus covering a wide wavelength band.

The laser can be doubled using either intra-cavity or external-cavity nonlinear conversion.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Embodiments of the present invention are directed to new types of high brightness surface emitting semiconductor lasers and superluminescent LEDs using a single chip optical amplifier having a plurality of electrically pumped semiconductor gain elements optically coupled to each other by a zigzag optical path within a low optical loss substrate. The optical amplifier chip permits a higher cumulative optical gain than is possible with an individual gain element, which supports high power amplifier or laser operation and the use of a wide variety of different semiconductor materials at different wavelengths, including the blue and ultraviolet. Additionally, individual gain elements may be separately modulated as reverse-biased p-n junction modulators to adjust the optical loss for gain-switching or mode-locking. The optical amplifier chip has applications that include its use as a surface emitting laser, a superluminescent LED (SLED), intra-cavity frequency doubled laser, or extra-cavity frequency doubled laser.

Figure 1A:
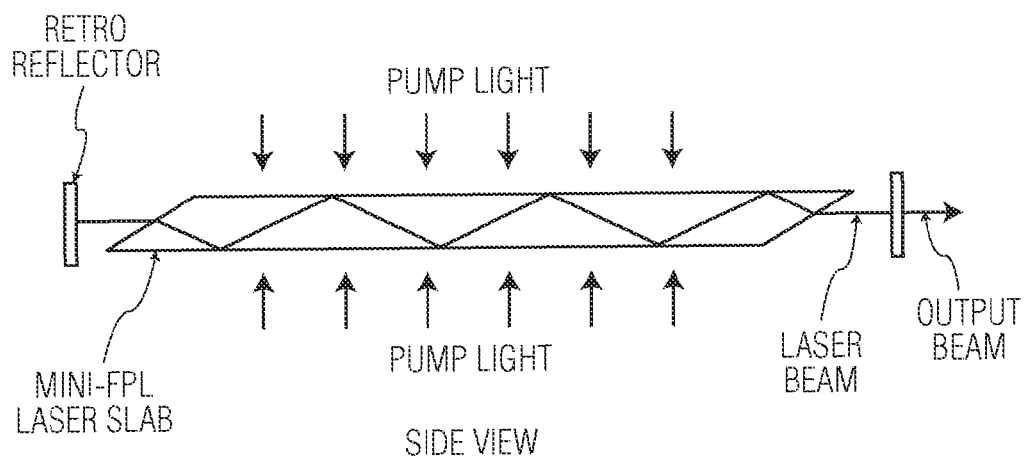
FIG. 1 illustrates a conventional Nd:YAG slab solid state zigzag laser in accordance with the prior art.
Figure 1B:
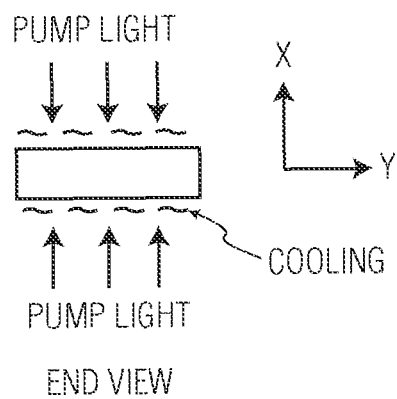
Figure 2:
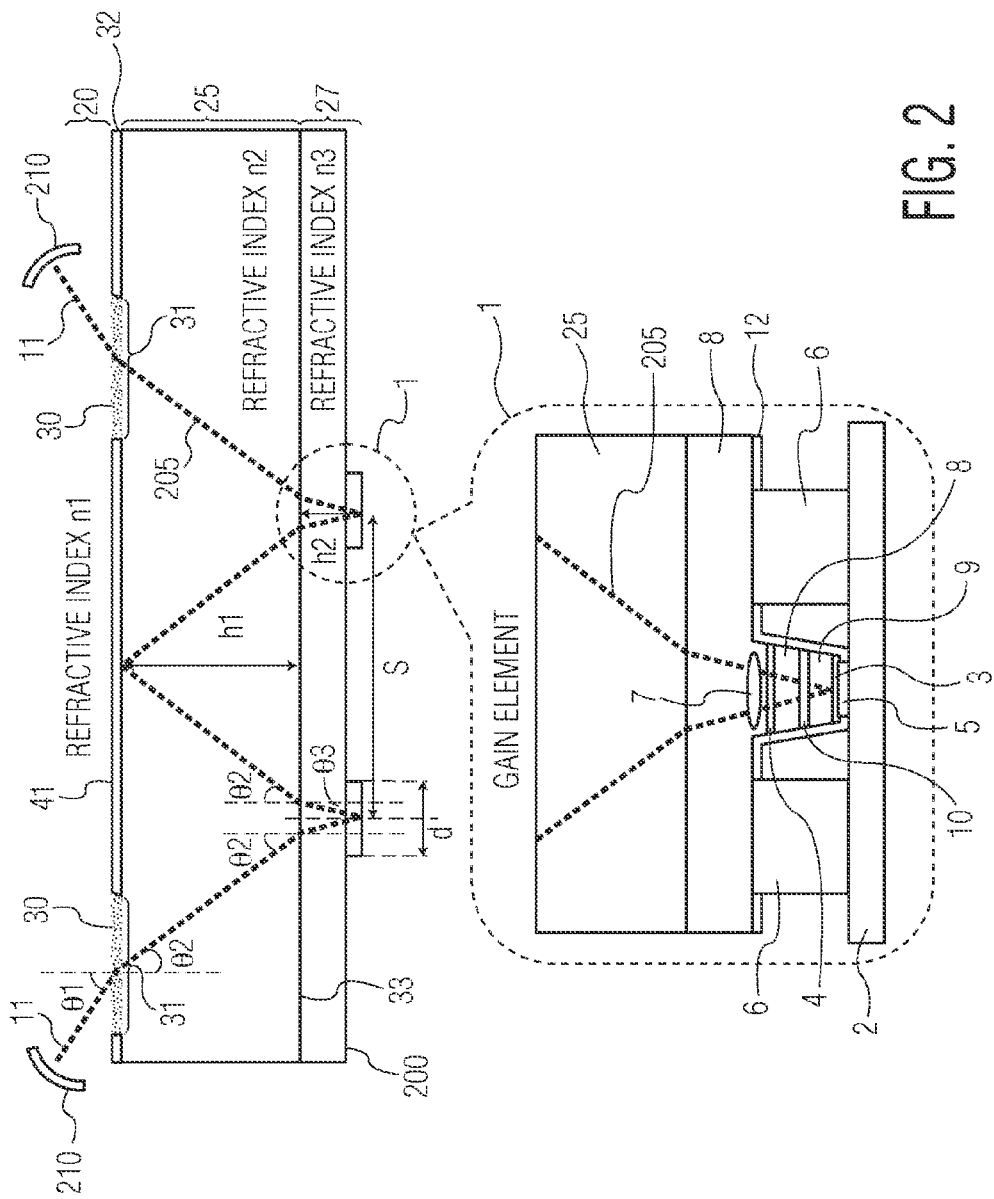
FIG. 2 is a schematic side view diagram of a semiconductor zigzag external cavity surface emitting laser having a junction-down geometry in accordance with one embodiment of the present invention and a crossection of one of the electrically-pumped gain elements.

FIG. 2 is a diagram of an embodiment of the present invention illustrating an exemplary optical amplifier chip 200, exemplary regenerative semiconductor gain amplifier elements 1, and a zigzag optical path 205 in the portion of the optical cavity internal to optical amplifier chip 200. The optical amplifier chip may be used in combination with one or more external retro-reflectors 210 or other external elements to form an extended cavity laser, such as an extended cavity laser in which the external retro-reflectors 210 are used to form a resonator cavity. Thus in a laser configuration the optical beam path 11 includes the zigzag optical path 205 within optical amplifier chip 200 and also the portion of the optical beam path 11 in the external portion of the resonator cavity. In a laser configuration having additional retro-reflectors 210 this configuration is described hereinafter as a Zig-zag Extended Cavity Surface Emitting Laser (ZECSEL).

The optical chip 200 includes a sequence of generally parallel layers and associated boundaries between layers having different material characteristics, such as different indices of refraction. The optical chip 200 includes surface regions 31 on a first boundary 32 of substrate layer 25 to couple light into and out of the optical amplifier chip 200. These surface regions 31 preferably include an anti-reflection coating (AR) coating 30 to efficiently couple light into/out of the optical gain amplifier. The AR coating 30 has low-reflectivity about a wavelength range for which the optical chip provides optical gain. However, it will be understood that the AR coating 30 may also be dichroic and be highly reflective (HR) at other wavelength bands. For example, if the optical chip is used with an optical frequency doubler element within the external cavity it may be desirable for AR coating 30 to be highly reflective at the frequency doubled wavelength.

A reflective surface 41 is provided on first boundary 32 to redirect light into a zigzag path. Reflective surfaces may comprise a layer having a reduced refractive index n1 (to generate reflection by total internal reflection), a dielectric layer high reflectivity coating, a distributed Bragg reflector, or a metal coating.

Polarization discrimination can be achieved by virtue of differences in reflection coefficients for different polarizations reflecting off at reflective boundaries 32, 33, and DBRs 3 and 4. It is desirable in many applications to have a linear polarization of output light. The choice of materials for reflective surface 41, the number of reflections off of reflective surface 41, and the angle of incidence on reflective surface 41 may also be selected to provide partial polarization discrimination. In one embodiment, these parameters are chosen to favor a single linear polarization and hence eliminate the requirement for a separate polarizing component.

Substrate layer 25 has a second (internal) boundary 33. A sequence of epitaxially grown semiconductor layers 27 is attached to second boundary 33, In some embodiments substrate layer 25 is a semiconductor substrate and epitaxially grown semiconductor layers 27 are grown on substrate layer 25. However, more generally substrate layer 25 may be formed using deposition techniques or by a substrate attachment technique. For example, in some embodiments substrate layer 25 is formed from glass, spun-on glass, or an optically transparent polymer.

Substrate layer 25 is substantially optically transparent at the intended wavelength of operation of the optical amplifier chip 200. As one example, the total optical loss at the intended wavelength of operation portion of the optical path through substrate layer 25 may be low, in comparison to optical gain. As another example, the absolute optical loss may be selected to be low. Alternatively, the substrate layer 25 may have an optical loss that is saturable such that the optical loss during normal operation is low compared to other optical losses.

A set of at least two individual semiconductor regenerative gain elements 1 are formed within the epitaxially grown semiconductor layers 27. While FIG. 2 illustrates two regenerative gain elements 1, it would be understood that it is contemplated that more generally other numbers of gain elements 1 can be included, such, as any number N at least equal to two, such as two, three, four, etc., where the number, N, of regenerative gain elements is scaled up for a particular application as required. Each regenerative gain element 1 has a diameter d. neighboring gain elements are separated by a center-to-center distance, S. The fill factor d/S is preferably no greater than 0.5. Selecting a fill factor of about 0.5 or less improves the thermal characteristics of the optical amplifier chip by reducing thermal cross-talk between individual regenerative gain elements 1 and allows efficient heat extraction (i.e. provides adequate thermal management of the chip). Additionally, there are other benefits to this arrangement. As will be described later, the individual regenerative gain elements are separated by a sufficient distance apart to maintain a predominantly Gaussian spatial mode with optical antinodes (high intensity optical intensity) in the gain region of each regenerative gain element 1.

The bottom portion of FIG. 2 illustrates in more detail an exemplary-individual regenerative gain element 1. An individual regenerative gain element 1 provides sufficient gain to act as an amplifier but does not have sufficient gain to act as an individual laser. An exemplary regenerative gain element includes an active gain region 10 and at least one distributed Bragg reflector (DBR) 3 to reflect light back into the zigzag optical path 205. The regenerative gain element may utilize a mesa structure to provide current confinement and to provide spatial mode discrimination. A round mesa structure can be etched to form a large optical aperture that can be 5 to 250 μm in diameter. Selection of the diameter, d, involved many tradeoffs. Power output may decrease if the mesa diameter is too small. However there may be more difficulties in achieving spatial mode control for diameters greater than about 200 microns. Therefore, in light of these tradeoffs, more typical ranges for high power operation are in the range of about 20 to 100 μm. The mesa should be designed to prevent parasitic lateral lasing in the active region. One approach is to etch angled walls on the mesas. Electrical current is confined by using implantation of protons, lateral oxidation or other equivalent means and allows an electrically-pumped region in the middle of the mesa. The mesa is covered with a passivating dielectric layer 12. The electrical contacts to the chip are formed by patterning openings in the dielectric layer and depositing p and n metal contacts 5 and 6.

In the present invention, at least two regenerative gain elements are utilized and the zigzag optical path results in light entering/exiting each DBR at a non-normal angle of incidence.

The present invention may be implemented using a wafer level fabrication technique that leverages off of wafer-level processing techniques previously developed for individual surface emitting lasers. Mesa-type semiconductor gain structures having a gain region and at least one DBR are known in the context of vertical extended cavity surface emitting lasers (VECSELs) having a single gain region with light striking each DBR at a normal angle of incidence are described in the following U.S. Pat. Nos. 7,189,589; 6,404,797; 6,778,582; 7,322,704; and 6,898,225, the contents of each of which are incorporated by reference in regards to mesa structures, gain structures, spatial mode control using a combination of a mesa structure and external optical elements, and extended cavity design. In particular, it is known in the VECSEL art that mesa structures having a diameter between about five microns to 250 microns can be formed that support a predominantly Gaussian spatial mode, with five microns to 200 microns being a preferred range. However, the VECSEL structures in the prior art lacked sufficient total optical gain to lase in many wavelength ranges and were also not bright enough for certain applications even in the supported wavelength ranges.

An exemplary individual laser gain element 1 with a regenerative amplification structure has a bottom distributed Bragg reflector (DBR) 3, active region 10 and an (optional) top DBR reflector 4. In regenerative amplification the two DBR reflectors 3 and 4 do not provide sufficient feedback for an individual laser gain element to lase on its own without additional external feedback. Selection of the reflectance of top DBR reflector 4 controls regenerative amplification characteristics and optical loss.

The bottom DBR reflector 3 preferably has a very high reflectivity and can, for example, be implemented by having sufficient number of high/low index λ/4 pairs to generate a reflectivity>99%. The material can be semiconductor, dielectric or hybrid semiconductor/metal or dielectric/metal. A dielectric DBR will have a fewer number of pairs, because of the larger contrast ratio which can be achieved in dielectric materials. The choice also involves optimization for thermal conductivity, which is where the semiconductor choice is preferred.

In the present invention the high reflectivity DBR mirrors are designed to take into account the angle of the incident beams inside the semiconductor material. As described below in more detail the zigzag path can be determined from Snell's law and by taking into account the angle of incidence with respect to the surface normal at each interface. As an example, θ3 will range from 13 to 25 degrees in the case of the GaInAlN/GaAlN material system. θ3 is of the order of 13 to 16 degrees for the AlGaAs system, 8.5 to 16 degrees for a GaP substrate and 10 to 16 degrees for GaAs. High reflectivity DBR mirrors can be optimized for maximum reflectivity in all cases.

The top DBR reflector 4, if used, can be implemented by having sufficient numbers of high/low index λ/4 pairs to generate a reflectivity of 0 to ~60%. The DBR of DBR reflector 4 is likely to be formed from a semiconductor material. The top DBR mirror 4 is optional and may be difficult to implement in some material systems. The zigzag laser has adequate gain to operate without it. For example, in one embodiment it is contemplated to use it in GaAs based material systems but not the GaInAlN/GaAlN material system.

In one embodiment the active layer 10 is made up of quantum wells or quantum dot material. In this embodiment it is assumed that the quantum wells are undoped. The number of wells and their thickness is similar to those used in current edge emitter designs (one to four quantum wells). This represents significantly fewer quantum wells than in VECSEL devices (typically ten or more) where round trip gain is limited.

The active region is surrounded by n and p doped semiconductor layers 8 and 9 respectively. In this embodiment it is assumed that the epitaxy is grown on n type substrates. The n and p layers can be reversed in case p type substrates are used instead. P+/n+ tunnel junctions can also be used to replace the p layer ohmic contact so that the laser would have two n type electrodes as an alternative to a standard p-n junction configuration. For example a second contact can be made in GaN material by utilizing a p+/n+ tunnel junction sandwiched between n and p GaN layers. In this case electrical contact is made to the n GaN layer.

A thermal lens 7 will typically form in the semiconductor material due to the thermal dependence of the refractive index in the material in combination with the comparatively high current density and comparatively large diameters of the gain regions. A thermal lens 7 has a comparatively slow onset, i.e., an onset that depends on thermal time constants, which can be on the order of tens of microseconds or longer. A thermal lens 7 is undesirable in conventional VECSELs because it makes it difficult to rapidly modulate a conventional VECSEL. That is, in a VECSEL that has a single gain element and which emits light normal to the plane of the DBRs, a thermal lens forms as the device turns on and heats up such that it is difficult to maintain power and beam quality while directly modulating the current of a conventional VECSEL at frequencies in the MHz range.

In contrast, the zigzag geometry of the present invention reduces the impact of the thermal lens 7 on the output beam because the zigzag path averages focusing effects across a set of two or more individual thermal lens 7. That is, each individual lens 7 is converging for light entering in one direction and diverging for light entering in another direction. Additionally, the zigzag path includes two or more gain elements with slightly different lens characteristics. As a result the net (average) focusing can be selected to average out, i.e., substantially cancel in a manner analogous to Nd:Yag slab lasers. See, e.g., the article by Kane et. Al., "Reduced Thermal Focusing and Birefringence in Zig-Zag Slab Geometry Crystalline Lasers," IEEE Journal of Quantum Electronics, pp. 1351-1354, Vol. QE-19, No. 9, 1983, the contents of which are hereby incorporated by reference. In this present invention, this means that the slow onset of the thermal lens has minimal impact on the direct-modulation of ZECSEL devices.

The top portion of FIG. 2 also illustrates the zigzag path 205 of the optical beam between the different layers which make up an exemplary structure. The structure can be analyzed using Snell's law at as a stack of three basic layers having indices of refraction n1, n2 and n3, marked as layers 20, 25, and 27. As an illustrative example, layer 25 may be a low optical loss layer having a height h1, such as a low-loss substrate or spin-on layer, layer 27 may correspond to an epitaxial semiconductor layer having a height h2 into which individual gain elements are formed, and layer 20 may be air or one or more additional fabricated layers. In a preferred embodiment n3>n2>n1. Beams reflect at the top reflector interface 41. Top reflector interface 41 can be a dielectric coating, a metal coating or a combination. In the case of high index materials it may be possible to utilize total internal reflection. The structure preferably has anti-reflective (AR) coatings 30 to allow low loss transmission between layers 20 and 25. Thus, the exemplary structure has a planar entrance and exit window regions. Depending on the design, layer 20 may be air or may be another substrate material.

The zigzag beam path can be analyzed using Snell's law at each boundary between layers having different indices of retraction to calculate the angles of the refracted optical beams, Snell's law is:

$$n1 \sin(\theta 1) = n2 \sin(\theta 2)$$

and can be applied at each boundary between materials with different indices of refraction.

Exemplary gain element diameters d range from 20 to 100 µm. The optimum separation, S, between two gain elements is dictated by thermal considerations and also to further maintain a stable single spatial mode. In particular, if S is too small, the gain elements may suffer thermal cross-talk and increased thermal resistance. Additionally, S may be selected to provide spatial mode discrimination to favor the fundamental Gaussian spatial mode. For high power lasers and SLEDs the center to center spacing is preferably >200 µm. The center-to-center spacing, S, can be controlled by selecting the thickness of low-optical loss lawyer 25. In particular, the separation S, can be selected relative to the diameter, d, of each gain element to reduce thermal cross-talk and/or reduce thermal resistance. Additionally, S is selected to support a single spatial mode. As one example, it may be desirable in a particular application to select the ratio of d/S to be some maximum number for thermal cross-talk and thermal resistance reasons. As an illustrative example, if S is 200 microns and d is 100 microns the ratio d/S=0.5. In this example, the edge-to-edge separation between gain elements will be 100 microns. In accordance with an embodiment of the present invention the entrance angle of the beam into gain block and the thickness of the layers is selected to permit S and S/d to be controlled.

In the example illustrated in FIG. 2 h1>h2 and the majority of the zigzag path is through a low optical loss substrate region that includes low-loss substrate layer 25. The beam thus enters through an AR window 30, receives optical gain at each gain element 1 and is slightly attenuated along each leg of the zigzag path through the low loss substrate 25. However, in accordance with the present invention the selection of the material composition and thickness of substrate 25 is preferably selected to achieve optical losses that are low in comparison to the cumulative gain of the gain elements 1.

It would be understood by one in the art that, the concept can be implemented in a number of material systems and can be optimized for processing ease and low cost of manufacturing. In a first example, consider at the GaInAlN/GaAlN material system. In this case n3~2.3 for GaN based materials, n2=1.77 for sapphire ($Al_2O_3$) and n1=1 for air. In this case we get a gain element separation of >200 µm for a sapphire thickness h1 of 340 µm to 154 µm corresponding to angles of incidence θ1 of 30 to 75 degrees respectively. This is a large operating space for this material system. Thus the fill factor can be selected to spread out the heat load with reasonable selections of sapphire thickness. In another embodiment, n1=1 for air, n2=1.5 for spin-on glass or PMMA, and n3=3.6 for a GaAs-based material system. In this case h1 varies from 211 µm to 119 µm for angles of incidence θ1 of 40 degrees to 75 degrees. In a second example consider that the substrate material is based on GaAlAs or GaP we have n1=1 for air, n2=3.4 for AlGaAs and n2=3.2 for GaP and n3=3.6 for GaAs. In the case of n2=3.4 the useful range of substrate thicknesses h1 ranges from 604 µm to 506 µm. This corresponds to incident angles θ1 of 55 to 75 degrees. This is the practical range of available substrates and it takes into consideration sawing of individual chips. For the case of n2=3.2, the range of substrate thickness h1 ranges from 596 µm to 315 µm. This corresponds to angles of incidence of 32 to 75 degrees respectively.

The optical amplifier chip 200 is mounted on a thermally-conductive heatsink 2. In one embodiment the heatsink material is electrically insulating (BeO, AlN, diamond, etc.) and is patterned to match the electrical contacts on the semiconductor chip. In this case, both n and p contacts are on the bottom of the chip. The gain elements can be connected electrically in either series or parallel. We call this a "single sided" configuration. The mounting configuration is "junction-down" configuration in that the p-n junction of the gain elements are mounted in close proximity to the heat sink.

In another embodiment, both top and bottom of the chip are covered with metal. This is a "double-sided" electrical contact. Openings in the top metal layer allow for the optical beams to pass through. In this case the heatsink can be electrically conductive and the gain elements would be connected electrically in parallel.

The optical amplifier chip 200 is compatible with wafer-scale processing, which means low cost of fabrication. Gain blocks can be screened at the wafer level, which also has a significant impact on manufacturing costs. Die attach and assembly can be done using automated equipment typically used in high volume laser diode manufacturing. This makes this approach eminently manufacturable for low cost commercial applications.

The optical amplifier chip 200 can also be used as the basis of a superluminescent LED. LED's for display and illumination have recently achieved higher powers and efficiencies especially in the blue and green regions of the spectrum. Thermal and gain considerations have been the main limiting factors in scaling up the powers. In addition the devices have been large etendue Lambertian sources with randomly polarized output beams. The zigzag optical gain block 1 proposed here can result in large gains with narrower emission and polarized spectra, enabling much brighter (higher power in a smaller solid angle), well polarized superluminescent LED sources. We call this zigzag superluminescent LED concept the ZSLED.

The zigzag optical path 205 couples all of the individual gain elements 1 along the zigzag optical path. The design parameters are selected so that in a lasing mode there is an antinode (high optical intensity) in the gain region of each individual gain element. Thus, light enters one regenerative gain element 1, is amplified, and is reflected back (from the DBR reflectors) towards reflective surface 41 and is then redirected towards another regenerative gain element 1 and so on. As a result of the zigzag coupling of all of the individual gain elements along the zigzag optical path 205 through the length of the optical amplifier chip 200 such that the total gain is adjustable by adding gain elements.

Figure 3:
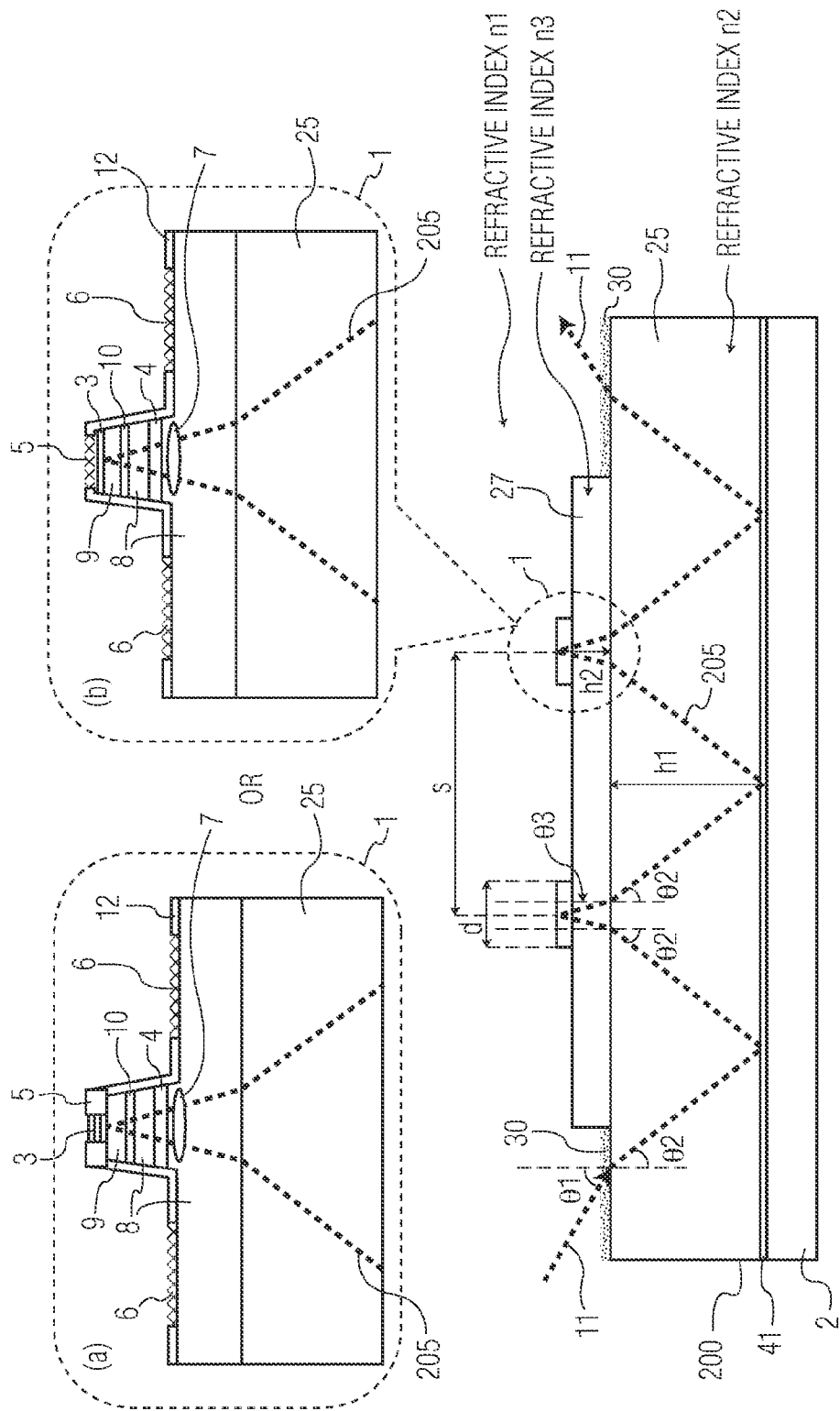
FIG. 3 is a schematic side view diagram of a semiconductor zigzag external cavity surface emitting laser having a junction-up geometry in accordance with one embodiment of the present invention and a crossection of one of the electrically-pumped gain elements.

FIG. 3 illustrates an embodiment of an optical chip designed to operate in a junction-side up geometry in which the individual gain elements 1 are located on the surface of the optical chip and the substrate layer is attached to the heat sink. Additionally, this configuration is desirable for a superluminescent LED. As can be seen in FIG. 3, many of the layers are identical to that of FIG. 2. However, the zigzag path is slightly longer. Comparing FIG. 2 and FIG. 3, it can be seen that the junction up configuration requires two additional reflections off of the reflective surface. That is, in the junction up configuration, light enters via AR window 30 and must be first reflected off reflective surface 41 before reaching a gain element.

One aspect of the present invention is in a junction-up configuration the separation S and fill factor d/S can be varied by, for example, selection of the thickness h1 of substrate layer 25 and the angles of incidence theta 1 similar to the design described for FIG. 2. This permits spacing of the gain elements to extract heat efficiently through the heatsink, 2. This configuration can be implemented effectively in the GaN material system where the substrate material, 25, can be sapphire, GaN or GaAlN, all of which have good thermal conductivities. In the junction-up configuration both n and p contacts are located at the top of the chip. This configuration permits wafer-level testing, because the electrodes can be probed at the wafer level and emission is at an angle. Moreover, no cleaving is required, which is difficult in some material systems such as GaN devices grown on sapphire substrates.

Figure 4:
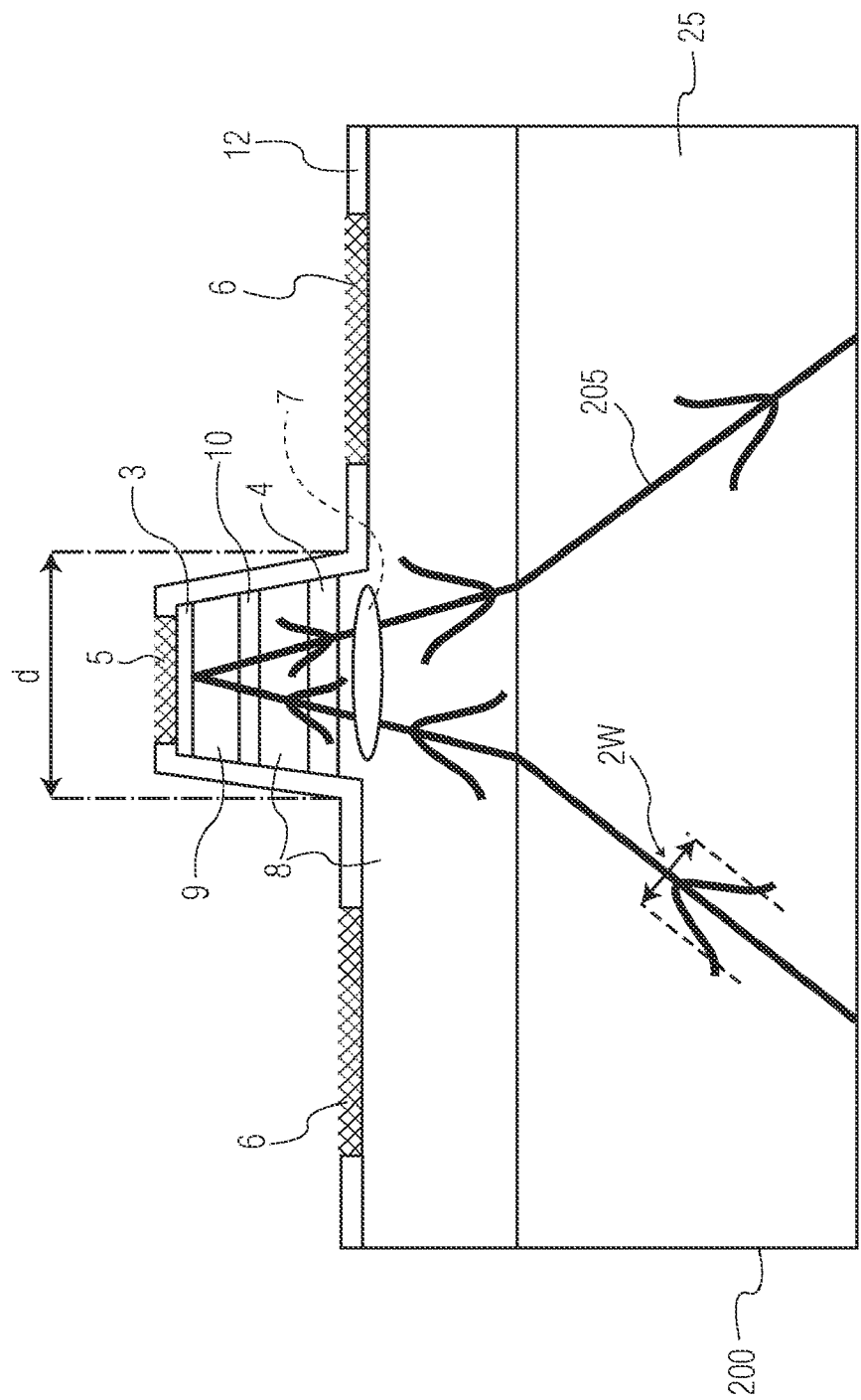
FIG. 4 is a schematic diagram through a cross section of the amplifier chip illustrating of the spatial Gaussian mode profile within the chip as the mode enters the gain element and is reflected back into the cavity from the distributed Bragg reflector.

FIG. 4 illustrates aspects of the laser spatial modes. As previously described, each gain element provides gain and also acts as a reflector. The design is selected so that the optical beam receives optical gain at one gain element, is reflected towards reflective surface 41 and then the beam is deflected to the next gain element 1 and so on until the beam completes its zigzag path through the length of the optical amplifier chip. In the present invention the optical design is preferably selected to favor a Gaussian TEM00 mode and to efficiently utilize the available optical gain. In the present invention the selection of the thickness h1 of substrate layer 25, the diameter d, and the separation distance S is selected to permit the propagation of predominantly Gaussian lateral spatial modes that propagate within the optical chip and that are redirected along the zigzag path to each of the regenerative gain elements 1. As previously described, layers 25 and 27 have a low optical loss at the lasing wavelength. The spatial mode will be determined, in large part, by the diameter and gain/loss characteristics of individual regenerative gain elements although the additional external optical elements 210 are also preferably selected to favor a Gaussian TEM00 mode.

Within the optical chip the spatial optical mode is preferably chosen to efficiently utilize gain in active gain region 10 of an individual gain element 1 and reflect off of bottom DBR 3 back into the zigzag path. In this example, the optical mode has a diameter that efficiently utilizes the available gain, within an individual gain element 1 and that further has an antinode (high intensity) at the active gain region 10. Thus, for example, the design may be chosen to operate in conjunction with the thermal lens 7 to focus the spatial mode into gain-providing portions of gain region 10 with an antinode at gain region 10.

As can be seen in FIG. 4 the optical path can be selected such that thermal lensing is averaged over input and output paths. In particular, in this illustrative example the spatial mode converges as it enters the gain element 1 via the thermal lens 7 and then equally diverges as it exits the gain element 1.

An important advantage of this design is that large mode diameters are supported, leading to substantial powers. The mode size supported by the laser depends largely on the mesa diameter d. Gaussian beams are characterized by a beam spotsize W, which has a functional dependence on z, the distance of propagation. The properties of Gaussian beams are well understood, as illustrated in J. T. Verdeyen, Laser Electronics, Prentice Hall ed., 1981, p. 61. In our case a Gaussian beam having a diameter of ~2 W can enter a gain element with an electrically-pumped aperture d similar in dimension to the beam size (2W) and continue to propagate in zigzag fashion through the rest of the laser cavity. If d were 100 µm, such a laser could support large Gaussian beams with diameters approaching 100 µm. The beam quality is well preserved, so that the ensuing laser beam is nearly diffraction-limited (TEM00) and very high power, resulting in a very high brightness laser, comparable in performance to much larger and complex solid state lasers.

Figure 5:
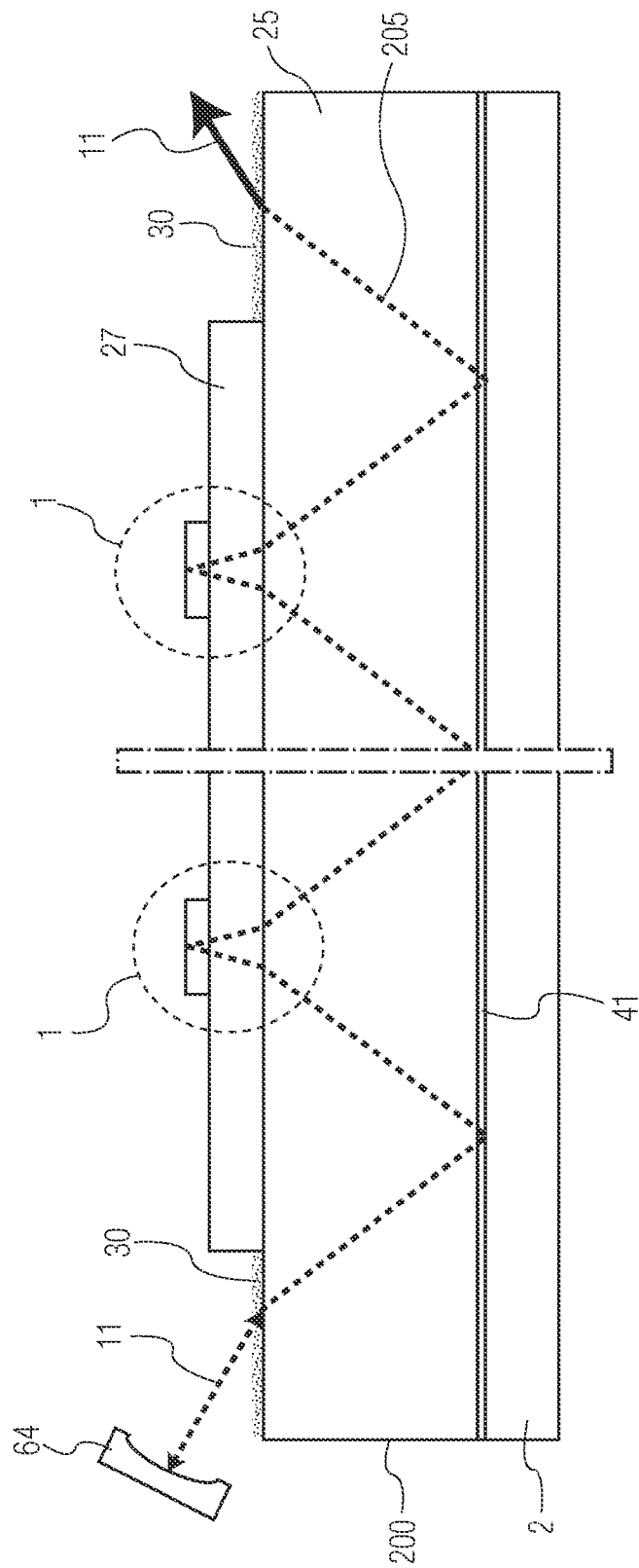
FIG. 5 is a schematic side view diagram of a superluminescent LED embodiment.

FIG. 5 illustrates an example in which a single mirror 64 is added to the junction-up optical chip in a superluminescent LED configuration. In a superluminescent LED configuration lasing is suppressed by, for example, reducing the amount of external optical feedback such as by elimination one of the external mirrors.

Figure 6:
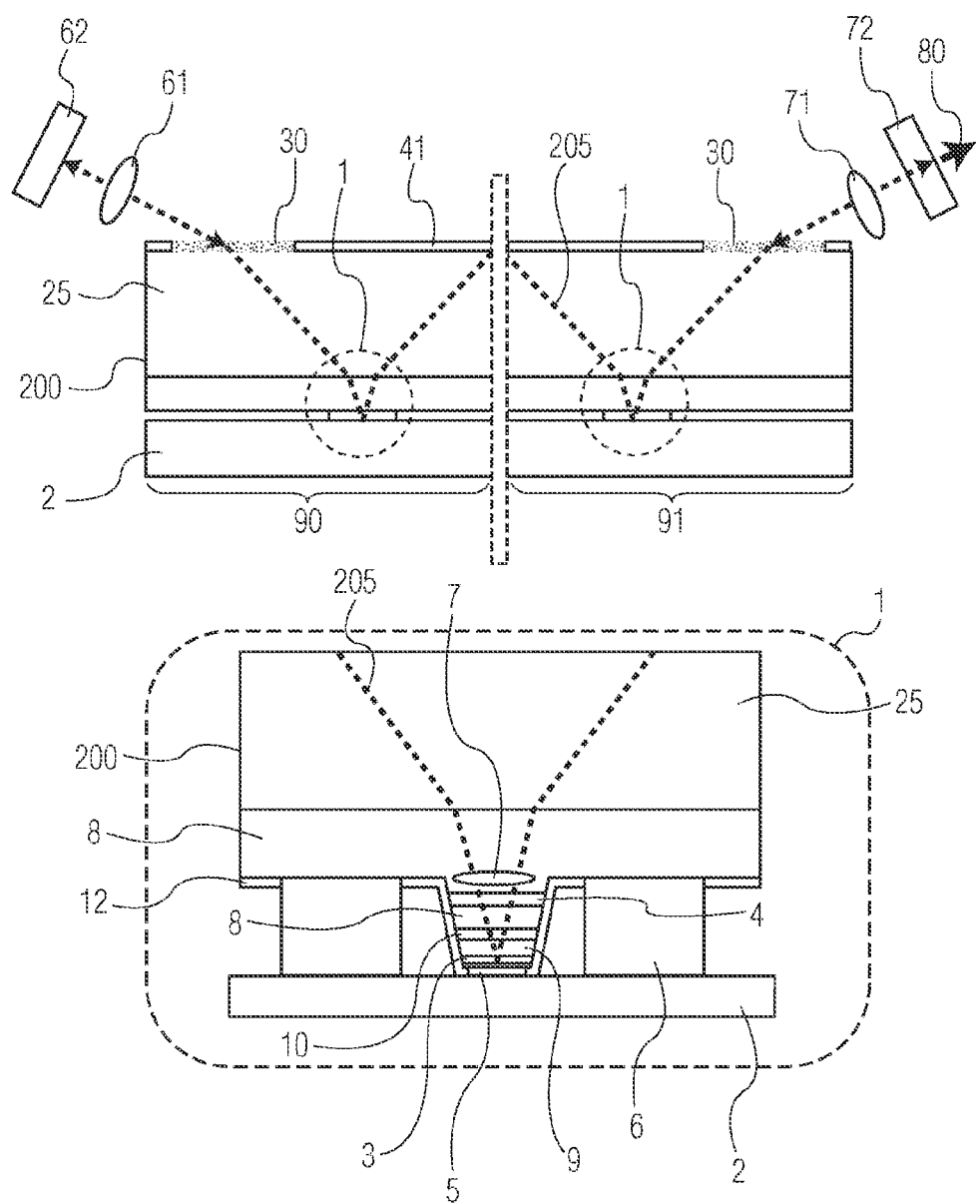
FIG. 6 is a schematic side view diagram of a junction-down embodiment that allows forward biasing for one or more the gain elements and independent reverse biasing of one or more gain elements to produce loss in the cavity and allow for gain switching or mode-locking.
Figure 7:
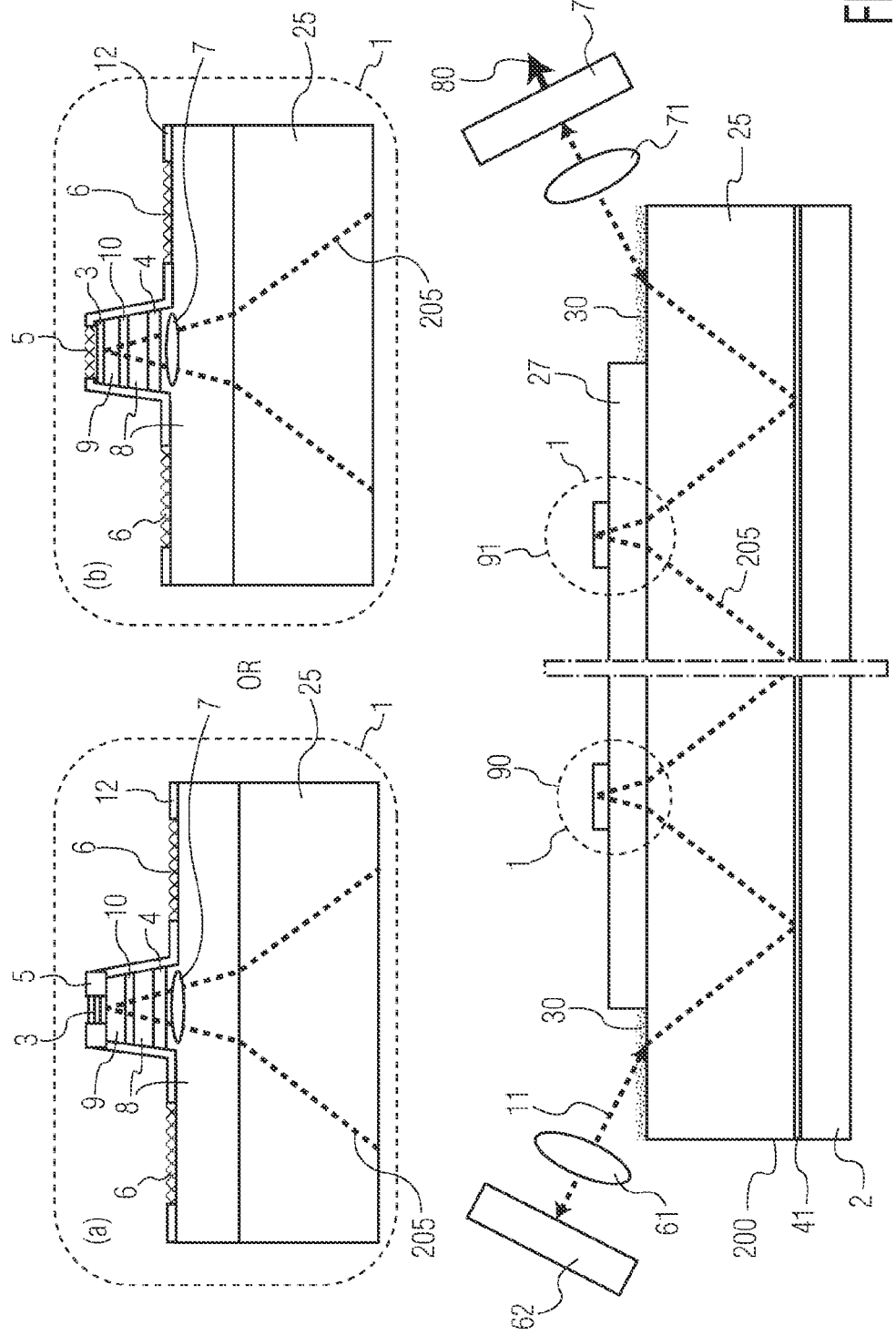
FIG. 7 is a schematic side view diagram of an junction-up embodiment that allows forward biasing for one or more the gain elements and independent reverse biasing of one or more gain elements to produce loss in the cavity and allow for gain switching or mode-locking.

FIG. 6 illustrates a junction-down embodiment in which at least one gain element is electrically isolated from other gain elements to provide control of the net optical gain the optical cavity. FIG. 7 illustrates a comparable junction-up configuration. A light beam enters/exits an individual gain element at a non-normal angle of incidence. Reflectors 62 and 72 in conjunction with beam forming optics 61, and 71 are provided to form the external laser cavity. The laser beam 80 is extracted from one end of the cavity. As previously described, in the ZECSEL geometry the individual gain elements are separated from one another by a separation distance, S. Individual gain elements may also be designed to be electrically separate elements capable of being driven either in parallel or with different biases. FIGS. 6-7 illustrates an embodiment in which the ZECSEL includes at least one regenerative gain element operated in a reverse-biased mode to provide a modulated optical loss that is controlled by varying the reverse bias on the p-n junction of the gain element. A forward biased region 90 includes at least one regenerative gain element that has a forward biased p-n junction to produce optical gain. Region 91 has separate electrical contacts and is electrically isolated from region 90 such, that it can be independently reversed biased by applying a reverse voltage to the electrodes 5 and 6. The optical loss in the optical chip can be rapidly modulated by changing the reverse bias in region 91. This permits switching the gain on and off at sub-picosecond time frames, (i.e. gain switching or mode-locking). High peak powers would be generated under such operating conditions.

Numerous variations on the optical components that perform an equivalent function may used to form the external cavity are possible. For example, the reflectors 62 and optics 61 may be replaced by curved reflective surfaces. In an alternate embodiment, a beveled surface can be etched into the transparent substrate material 25 and HR coated to form one of the ends of the cavity. Additionally, one or more external grating elements may be used to provide optical feedback and/or to provide longitudinal mode discrimination.

Figure 8:
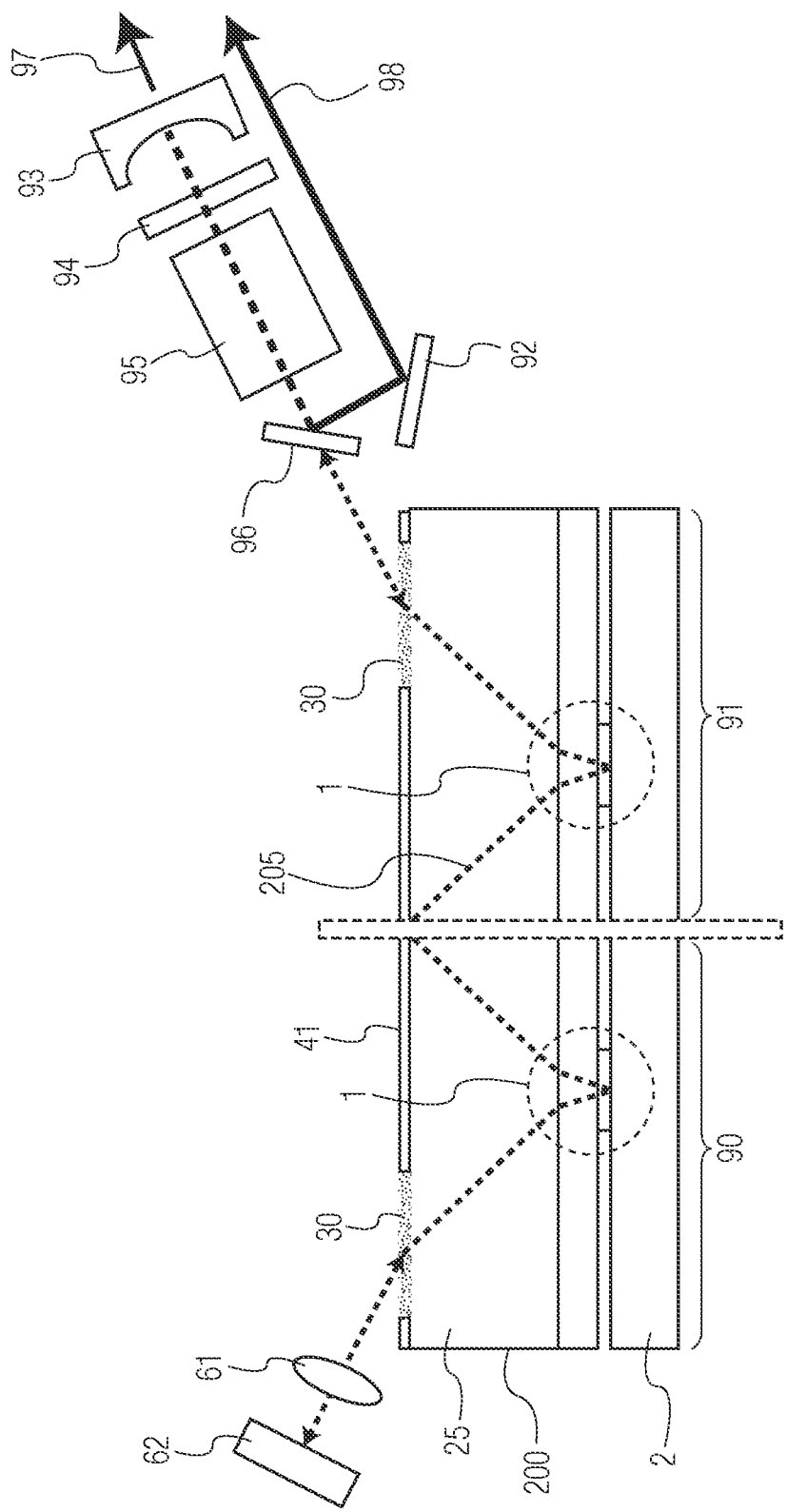
FIG. 8 is a schematic side view diagram for intracavity frequency doubling of a ZECSEL in accordance with one embodiment of the present invention.

FIG. 8 illustrates a ZECSEL having intracavity frequency doubling. In this example, the optical chip is similar to the embodiment of FIG. 6 to support gain-switching or mode-locking. However, the external optical components are arranged to provide for intra-cavity frequency doubling. The ability to produce fast modulation offers a significant advantage in achieving high peak power at the fundamental power, which in turns improves the output of frequency-doubled light. The efficiency of frequency-doubling processes has a strong dependence on the intensity of the pump light. In particular, the efficiency of frequency doubling processes is strongly dependent on the intensity of the pump light and is generally proportional to the square of the intensity of the pump light. This is particularly useful when these lasers are used to produce second harmonic light emission since high peak intensities can be generated with no facet damage and the non-linear conversion process for blue-green goes as the square of the infrared (IR) intensity. The intra-cavity approach allows the build-up of the longer wavelength intensity and thus can usually produce higher doubled powers since the nonlinear conversion is proportional to the square of the intensity. A non linear optic (NLO) material 95 provides frequency doubling. The NLO can be conventional non-linear optical materials such as PPLN, KTP, PPLT. PPLT would be favored in shorter wavelength (UV) applications. Mirror 93 closes the cavity. It reflects all emission at the longer wavelength back into the gain chip, and it provides outcoupling for the doubled beam. Also included is a notch filter 94 that narrows the gain chip emission wavelength for efficient doubling. Alternately, an etalon can be used in place of the filter, or a volume Bragg grating (VBG) can be used to replace one of the laser mirrors. The dichroic beam splitter/polarizer 96 insures proper polarization for doubling in VECSELs, but the polarization function will likely not be needed in the ZECSELs. Both forward beams 97 and backward beams 98 doubled beams are extracted from the cavity. The latter is reflected out from mirror 92. A single cross-polarized beam can be achieved by adding a λ/4 plate in the visible beam path and eliminating the second (backward) beam reflector 92.

Figure 9:
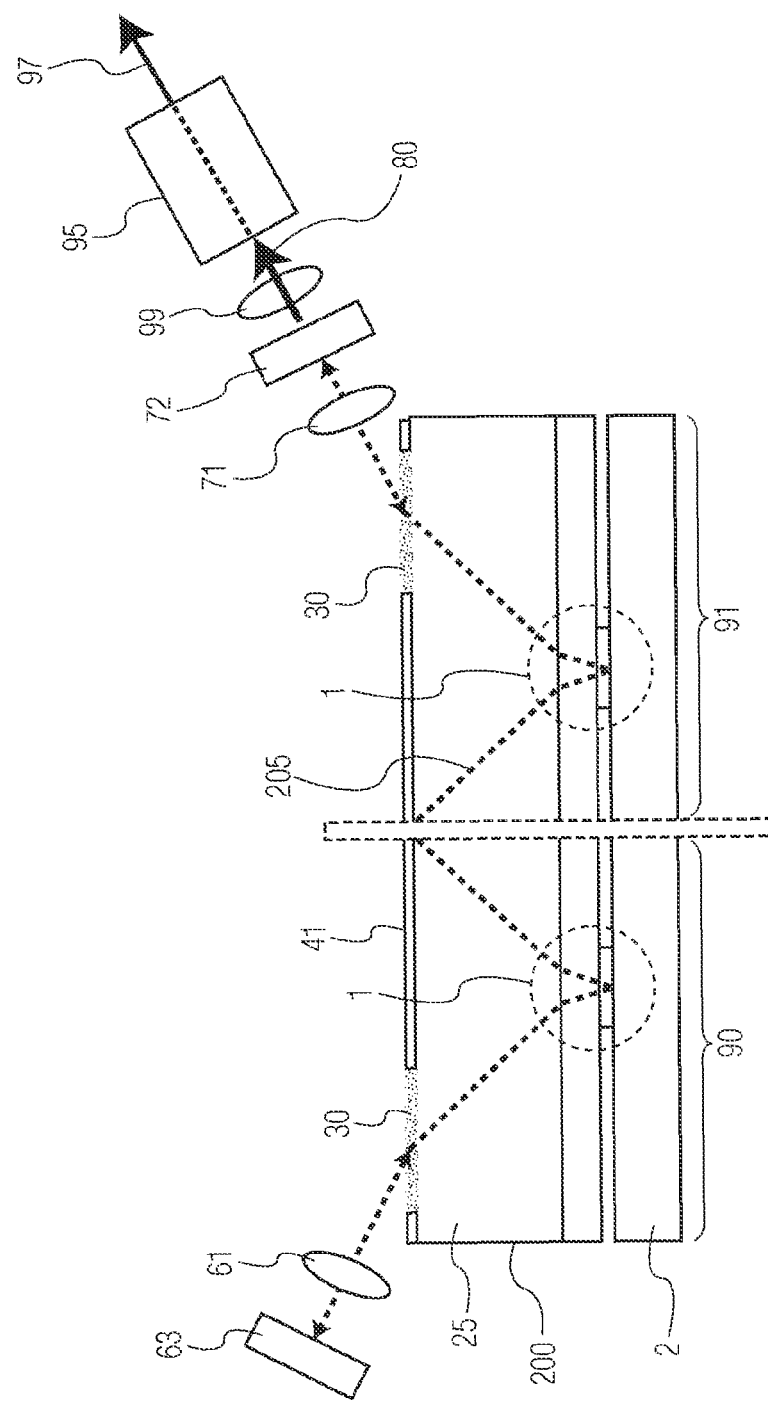
FIG. 9 is a schematic side view diagram, of an extra-cavity doubled embodiment of the present invention and shows an embodiment of this invention in which the ZECSEL laser operates as a single frequency laser in gain-switched or mode-locked configuration.

FIG. 9 illustrates a ZECSEL having extra-cavity frequency doubling. A large number of the optical components are similar to those previously described. However, in the example of FIG. 9 the NLO is placed outside of the laser cavity. The laser itself is a stand-alone single frequency laser. Single frequency can be achieved by using grating elements (63) in the cavity. Alternately, an intra-cavity etalon can be used, or the laser can be operated in a MOPA configuration using a single frequency external master oscillator (MO). In this preferred embodiment the laser is operated in gain-switched or mode-locked operation in order to produce high peak powers.

Because the new ZECSEL laser offers a totally new design space for semiconductor lasers, it enables high power, high brightness and a diffraction limited beam at a wide range of emission wavelengths. In particular the ZECSEL can be fabricated in a wide range of material systems used to manufacture semiconductor lasers and LEDs. The ZECSEL can be used over a wide wavelength range (UV to far IR) by adjusting the quantum well (QW) or quantum dot active region materials and adjacent transparent regions. This includes GaN based materials including GaInAlN/GaAlN (0.3-0.5 μm emission wavelength), ZnSSe/ZnMgSSe (0.45-0.55 μm emission wavelength), GaAlInP/GaAs (0.63-0.67 μm emission wavelength), GaAlAs/GaAs (0.78-0.88 μm emission wavelength), GaInAs/GaAs (0.98-1.2 μm emission wavelength), GaInNAs/GaAs (1.2-1.3 μm emission wavelength), GaInAsP/InP and AlGaInAs/InP (1.3-1.6 μm emission wavelength). The wavelength range can also be extended in the 2-10 μm range by using the same geometry with other material systems (Pb-salt materials for example). In the GaInAlN/GaAlN material system this permits direct emission in the UV, blue and green regions of the spectrum.

One advantage of the present invention is that it can be used to achieve surface emitting lasers in the GaN materials system. The GaN materials system is of interest to achieve visible and UV wavelength lasers. Conventionally these materials provide insufficient optical gain to achieve a high power surface emitting laser. However, in the present invention, the number of individual regenerative gain elements can be increased until the ZECSEL supports lasing at a desired wavelength in the GaN materials system.

Table 1 illustrates exemplary design considerations specific to a GaN based ZECSEL.

TABLE 1

| | Element | GaN-based Implementation |
|---|---|---|
| 1 | Gain element - contains processed (etched, metalized, etc.) semiconductor structure | Not specific to GaN materials |
| 2 | Heatsink - wafer is attached to heatsink using solder or equivalent materials. For single sided structure heatsink is electrically insulating material patterned with metal pads for (+) and (−) electrical connections | For junction up structure the heatsink can be electrically conductive (metal such as Cu or CW for example). |
| 3 | Highly reflective DBR layer - semiconductor or dielectric material | Dielectric DBR may consist of $Ta_2O_5/SiO_2$ of $HfO_2/SiO_2$ for example. Semiconductor DBR may be AlGaN/GaN or AlN/GaN. |
| 4 | Partial DBR reflector is used to partially reflect optical beam to develop regenerative gain | Dielectric DBR may consist of $Ta_2O_5/SiO_2$ or $HfO_2/SiO_2$ or $ZrO_2/SiO_2$ for example. Semiconductor DBR may be AlGaN/GaN or AlN/GaN. |

TABLE 1-continued

| | Element | GaN-based Implementation |
|---|---|---|
| 5 | P metal layer for structures grown on n doped substrate material (p and n may be reversed in structures grown on p doped semiconductor substrate material) | Pd/Au on p type GaN for example. Ring contact with opening for dielectric if dielectric mirror is used (FIG. 3(a)). Covers semiconductor material in the configuration shown in FIG. 3(b) |
| 6 | n metal layer for structures grown on n doped substrate material (p and n may be reversed in structures grown on p doped semiconductor substrate material) | Al/Ti/Au on GaN for example |
| 7 | Thermal lens is formed in semiconductor material due to the thermal dependence of the refractive index in the material | Not specific to GaN materials |
| 8 | n-doped semiconductor layer in one embodiment | GaN and AlGaN cladding layer |
| 9 | p-doped semiconductor layers in one embodiment | GaN and AlGaN cladding layer. May be replaced by a p+/n+ GaN - based tunnel junction in another embodiment. |
| 10 | Active region - doped or undoped quantum well or quantum dot region | InGaN/GaN based quantum wells or dots |
| 11 | Optical beam path | Not specific to GaN materials |
| 12 | Dielectric passivation layer | $ZrO_2$ for example |
| 20 | Material with a refractive index n1 | Air in this embodiment |
| 25 | Material with a refractive index n2. May be substrate material for example | Sapphire or GaN or GaAlN for example. The substrate may have polar on non-polar crystal orientation for GaN. |
| 27 | Material with a refractive index n3 | This corresponds to the GaN/AlGaN p and n type cladding layers and the InGaN/GaN quantum wells |
| 30 | Anti reflective (AR) coating layer | Tailored for materials used |
| 31 | First surface opening for optical beam transmission | Not specific to GaN materials |
| 32 | First boundary of layer 25 | Not specific to GaN materials |
| 33 | Second (internal) boundary of layer 25 | Not specific to GaN materials |
| 41 | Top reflector. Can be dielectric, metal or a combination. May have total internal reflection in some high index materials | Not specific to GaN materials |
| 61 | Beam-shaping optics | Not specific to GaN materials |
| 62 | External mirror M1 - high reflectivity coating | Not specific to GaN materials |
| 63 | Grating - based reflector | Not specific to GaN materials |
| 64 | Reflective optics used to produce single-ended SLED emission | Not specific to GaN materials |
| 71 | Beam-shaping optics | Not specific to GaN materials |
| 72 | Outcoupling mirror M2 - partially reflective coating | Not specific to GaN materials |
| 80 | Output optical beam | Not specific to GaN materials |
| 90 | Forward biased elements produce gain | Not specific to GaN materials |
| 91 | Reverse biased elements introduce loss and can be used to gain-switch or mode-lock the laser | Not specific to GaN materials |
| 92 | reflector | Not specific to GaN materials |
| 93 | Outcoupling mirror | Not specific to GaN materials |
| 94 | Notch filter | Not specific to GaN materials |
| 95 | NLO material | Not specific to GaN materials |
| 96 | Dichroic beam splitter/polarizer | Not specific to GaN materials |
| 97 | Forward second harmonic beam | Not specific to GaN materials |
| 98 | Backwards second harmonic beam | Not specific to GaN materials |
| 97 | Output doubled beam | Not specific to GaN materials |
| 99 | Focusing optics | Not specific to GaN materials |
| 200 | Optical chip | Not specific to GaN materials |
| 205 | Zigzag optical path | Not specific to GaN materials |
| 210 | Curved resonator optics | Not specific to GaN materials |

Table 1: Exemplary Design Consideration for short wavelength GaN based ZECSEL.

ZECSEL embodiments of the present invention provides numerous advantages over the prior art. First, the number of regenerative gain elements can be selected to increase the total optical gain. This permits, for example, the use of lower-gain semiconductor materials, such as GaN based materials, which are not practical in conventional VECSEL laser structures that have a single gain element. Thus, the present invention permits a larger range of semiconductor materials (and hence a larger range in emission wavelengths) than conventional VECSEL structures. Second, embodiments of the present invention support gain-switching and mode-locking, which have proven difficult to implement in a practical manner in VECSEL-type lasers. In particular, a ZECSEL structure can include one or more regenerative gain elements operable in a reverse-biased mode to control the optical loss in the cavity to support gain-switching or mode-locking for higher peak powers.

As previously described, embodiments of the present invention support surface emitting laser structures over a greater range of wavelengths than is possible with conventional VECSELs. Moreover, the capability to increase the number of gain elements to improve high power operation and to further support gain switching or mode locking for high peak powers makes the ZECSEL capable of efficient frequency doubling over an extraordinary wide range of wavelengths.

The ZECSEL configuration is also highly scalable. The number of gain elements along a zigzag path can be increased beyond two to increase the potential optical power. Multiple ZECSELs can be arranged in one-dimensional arrays of lasers on an optical chip, as illustrated in FIG. 10 and can be scaled up to very large powers.

Figure 10:
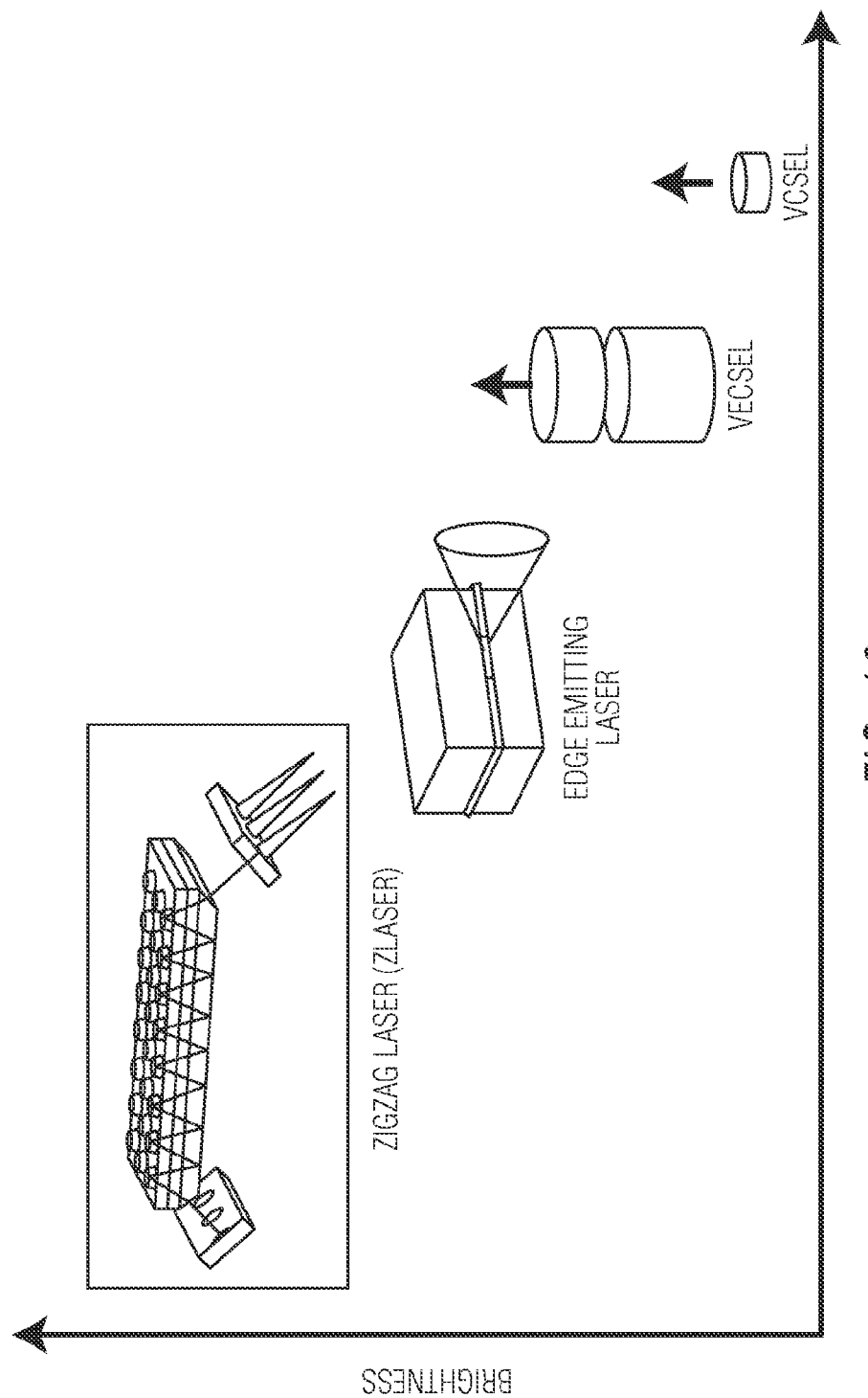
FIG. 10 is a comparison of the brightness of the ZECSEL to prior art semiconductor lasers.

FIG. 10 illustrates a comparison of the brightness of ZECSEL to other types of semiconductor lasers, such as edge emitting lasers, VECSELs, and vertical cavity surface emitting lasers (VCSELs). FIG. 10 illustrates a comparison only of potential brightness. However, other figures of merit are also potentially superior in a ZECSEL.

Conventional Edge emitting semiconductor lasers (EESLs) have a high brightness at lower powers, but also have astigmatic elliptical beams and suffer from facet damage at high intensities. EESLs are prone to catastrophic optical damage at the laser facets due to the high optical intensities incident on the facets. This limits high peak power operation and it impacts reliability of the devices under continuous wave (CW) operation. Another shortcoming of EESLs is beam quality. High power EESLs typically use a broad area emitting aperture which supports a large number of lateral modes, i.e. the multi-mode output beams have a large beam parameter M2 which is at least an order of magnitude larger than the ideal M2 of 1 for a diffraction-limited beam. The optically-confining waveguide is typically rectangular, resulting in highly asymmetric elliptical output beams with wide emission angles in the fast axis. Typical EESL beams are often astigmatic as well. Primarily for these reasons, edge emitting lasers have been limited in peak power and brightness and have not been able to compete with diode pumped solid state lasers that can produce orders of magnitude higher powers in diffraction limited beams In the prior art there were two main types of surface emitting lasers, Vertical Cavity Surface Emitting Lasers (VCSELs) and VECSELs. Both VCSELs and VECSELs having a single gain region and emit light normal to the surface of internal DBR reflectors. The design constraints for these types of lasers arise from electrical carrier confinement, thermal management, gain and cavity loss. Usually such devices employ distributed Bragg reflectors (DBRs) which are implemented by having sufficient number of high/low index quarter wavelength pairs to produce very high mirror reflectivities. Generally, semiconductor DBR mirrors have lower contrast (difference between the two refractive indices) than dielectric mirrors, and as such require a large number of pairs (i.e. this requires very accurate control during epitaxial growth and takes up significant reactor time). Often, the choice of DBR semiconductor layers and layer composition compatible with the rest of the structure is very limited, especially in the red (~630 nm), blue and UV regions of the spectrum.

VCSELs rely solely on feedback within the VCSEL. As a result, VCSELs typically have a small aperture and a low power.

VECSELs have a single surface emitting gain element and an external mirror to provide additional feedback. The external mirror (illustrated by the upper element) also provides additional control over spatial modes to facilitate larger beam diameters. However, the total gain in a VECSEL is limited. For example VECSEL devices have round trip gains of the order of 1 to 2%. By way of comparison, an edge emitting semiconductor laser may have round-trip gains that are a factor of 100 to 500 limes larger than a VECSEL. The low total gain in a VECSEL limits the choice of materials that can be used (and hence the emission wavelength) and also imposes various barriers to achieving high power output even at supporting wavelength ranges. Practical VECSEL devices have only been made successfully in the GaInAs/GaAs material system and operate in the ~0.98 to ~1.2 µm range.

The limitation for conventional surface-emitting lasers, such as VECSELs has been the very short length of the laser gain region (i.e. small roundtrip gain in the cavity). To overcome the cavity loss, they require high reflectivity resonator mirrors. These lasers have circular beams and much better bream quality than edge-emitting lasers. However, the limited round trip gain available imposes limitations on the maximum output power. VECSELs use large apertures (typically ~100 µm or greater) and produce nearly diffraction-limited beams, but the output power is limited by the available round trip gain.

The ZECSEL permits higher optical gain than a VECSEL while also retaining many of the desirable characteristics of a VECSEL such as high quality diffraction limited beam. Additionally, the ZECSEL further provides advantages over VECSELs such as polarization control and a reduction or elimination of thermal lens effects. The ZECSEL has a zigzag path within an optical chip that permits the gain of multiple gain elements to be combined such that the brightness is potentially greater than both EESLs and VECSELs. However, the ZECSEL is also still a surface emitting laser structure with a comparative large beam diameter and a predominantly TEM00 Gaussian mode and a nearly diffraction limited beam. Moreover, the ZECSEL can be designed as an array, if desired, to further increase output power. Additionally, the ZECSEL can be gain switched or mode-locked. As a result, a ZECSEL has a potential brightness greater than previously known types of semiconductor lasers. ZECSELs can be scaled to achieve comparable round-trip gains with edge-emitting lasers, while producing a circular beam with an M2 of close to 1 (diffraction limited). It is therefore expected that powers of over 20 W per laser in the IR and powers of >10 W per laser in the visible should be possible. The same structure also enables gain-switching and mode-locked operation for the realization of high peak pulse intensities. In addition, these lasers can be scaled in ED arrays for even greater powers.

The ZECSEL laser thus offers a wide design space for the realization of high power and brightness for many new visible and UV laser wavelengths. This can be achieved both by direct laser emission, and by doubling using conventional non-linear optical (NLO) materials such as KTP, LBO, BBC), PPLN, PPLT, PPKTP, etc. Because of the high intensity of the laser and its superior beam quality such nonlinear doubling can be done efficiently both intracavity and in extra-cavity configurations. This results in a high brightness laser with the potential of producing over 10 W of average power from a single diffraction-limited beam.

One significant improvement over VECSEL lasers is that the ZLASER laser has much higher round trip gain and can generate much higher IR intensities. Therefore one can use much shorter and smaller NLO crystals in doubling applications. This not only makes the laser cheaper, but also opens up the visible bandwidth that makes alignment and thermal control of the NLO crystal easier and lowers the spectral width requirements for the cavity.

Unlike other semiconductor lasers, the ZECSEL is the first semiconductor laser which can operate in the UV and blue region of the spectrum and be doubled into the deep UV region. Short pulse operation and high peak powers are instrumental in implementing this geometry. The emission wavelength in this material system extends from the UV to the green region of the spectrum. Other wavelengths in the red and near IR regions of the spectrum can be achieved using material systems based on GaAs and GaP.

The ZECSEL is also highly manufacturable. The optical amplifier chip 200 can be manufacturing using a wafer-level process. The optical amplifier chip 200 may be implemented to minimize the number of additional components and critical alignment steps used to form a packaged ZECSEL, Moreover, various embodiments are compatible with wafer-level testing.

One potential application of the ZECSEL is to replace other types of solid state lasers, such as diode pumped solid state lasers (DPSSs). Target markets include display, illumination, medical, materials processing, and graphic arts. High brightness applications in these markets have been dominated by diode pumped solid state (DPSS) lasers. However, size, cost, efficiency, multiple wavelength selection and modulation requirements favor direct semiconductor or wavelength doubled semiconductor lasers over DPSS solutions. The ZECSEL embodiments of the present invention addresses the key requirements for these markets. They are compact, efficient and low cost. Additionally they are capable of producing multiple watts of wavelength-selectable emission in nearly-diffraction limited beams and they can be directly modulated, gain switched and mode-locked for high peak power applications.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. A semiconductor zigzag external cavity surface emitting optical apparatus, comprising:
   a chip having a sequence of layers of materials;
   the chip including at least two regenerative semiconductor gain elements disposed proximate a planar layer boundary of the chip; each individual regenerative semiconductor gain element including an electrically pumped gain region to provide gain to an optical mode of the apparatus and at least one distributed Bragg reflector, each regenerative semiconductor gain element having a diameter, d, with a separation distance, S, between each neighboring regenerative semiconductor gain element selected such that a fill factor defined by d divided by S is less than one;
   the chip including a substrate layer region including at least one layer, the substrate layer region being substantially transparent at a wavelength of the optical mode with the substrate region including a reflective surface parallel to and spaced apart from the planar layer boundary associated with the at least two regenerative gain elements;
   at least one optical entrance/exit surface region of the chip to couple light into the chip in a zigzag path via a sequence of reflections between the reflective surface of the substrate region and the distributed Bragg reflectors of each regenerative semiconductor gain element with the zigzag path further having an antinode at the gain region of each regenerative semiconductor gain element;
   at least one external optical element to form an external cavity providing optical feedback back into the chip and to control transverse optical mode characteristics of the optical mode to form an output beam having a fundamental Gaussian spatial mode.

2. The optical apparatus of claim 1 wherein the fill factor d/S is less than 0.5.

3. The optical apparatus of claim 1 wherein the diameter, d, of each regenerative amplifier is in the range of five to two-hundred microns.

4. The optical apparatus of claim 3 wherein each regenerative amplifier comprises a round mesa to provide current confinement and spatial mode discrimination.

5. The optical apparatus of claim 1, wherein the reflective surface of the substrate region is selected from the group consisting of a metal coating, a dielectric coating, a high reflectivity coating, a refractive index step to generate total internal reflection, and a distributed Bragg Reflector.

6. The optical apparatus of claim 1, wherein the at least one distributed Bragg reflector comprises a first distributed Bragg reflector disposed on one side of the gain region proximate to the substrate region and a second distributed Bragg reflector disposed on the other side of the gain region, the second distributed Bragg reflector having a greater reflectivity than the first distributed Bragg reflector.

7. The optical apparatus of claim 1, where the optical beam experiences total internal reflection at the reflective surface.

8. The optical apparatus of claim 1, wherein the s and p polarizations reflect at different angles from the reflective surface, the separation distance S and a height H of the substrate layer region are selected to favor an optical mode having a linear polarization.

9. The optical apparatus of claim 1, wherein each regenerative semiconductor gain element forms a thermal lens due to the thermal dependence of the refractive index of the gain region, the zigzag path selected, to at least partially cancel the effects of each thermal lens in a lasing mode.

10. The optical apparatus of claim 1, wherein the substrate region comprises a semiconductor region substantially optically transparent at the emission wavelength.

11. The optical apparatus of claim 1, wherein the substrate region is selected from the group consisting of a semiconductor, sapphire, glass, spin-on glass, or an optically-transparent polymer material.

12. The optical apparatus of claim 1, wherein each regenerative semiconductor gain element lacks sufficient feedback from its respective at least one distributed Bragg reflector to lase on its own without additional feedback.

13. The laser of claim 1, further comprising an intra-cavity frequency doubler.

14. A semiconductor zigzag external cavity surface emitting laser, comprising:
   a chip having a sequence of layers of materials;
   the chip including at least two regenerative semiconductor gain elements disposed proximate a planar layer boundary of the chip; each individual regenerative semiconductor gain element having a p-n junction including an electrically pumped gain region and at least one distributed Bragg reflector, each regenerative semiconductor gain element having a diameter, d, with a separation distance, S, between each neighboring regenerative semiconductor gain element selected such that a fill factor defined by d divided by S is less than one;

the chip including a substrate layer region including at least one layer, the substrate layer region being substantially transparent at a wavelength of the optical mode with the substrate region including a reflective surface parallel to and spaced apart from the planar layer boundary associated with the at least two regenerative semiconductor gain elements;

at least one optical entrance/exit surface of the chip to couple light into the chip in a zigzag path via a sequence of reflections between the reflective surface of the substrate region and the distributed Bragg reflectors of each regenerative semiconductor gain element with the zigzag path further having an antinode at the gain region of each regenerative semiconductor gain element;

at least one external optical element to form an external cavity providing optical feedback back into the chip and to control transverse optical mode characteristics of the optical mode to form an output beam having a predominantly Gaussian spatial mode;

at least one of the regenerative semiconductor gain elements operable as a forward biased p-n junction to provide optical gain and at least one of the regenerative semiconductor gain elements operable as a reverse-biased p-n junction to modulate the loss of the laser.

15. The laser of claim 14, wherein at least one of the regenerative semiconductor gain element is operated as reverse-biased p-n unction to provide one of gain switching or mode-locking of the laser.

16. The laser of claim 14, further comprising an intra-cavity frequency doubler.

17. A semiconductor zigzag external cavity surface emitting laser, comprising:

a chip having a sequence of layers of materials;

the chip including at least two electrically pumped regenerative semiconductor gain elements disposed proximate a planar layer boundary of the chip; each individual regenerative semiconductor gain element having a p-n junction mesa to provide current confinement and spatial mode control, a gain region and at least one distributed Bragg reflector, each regenerative semiconductor gain element having a mesa diameter, d with a separation distance, S, between each neighboring regenerative semiconductor gain element selected such that a fill factor defined by d divided by S is less than 0.5 and with d being at least five microns;

the chip including a substrate layer region including at least one layer, the substrate layer region being substantially transparent at a wavelength of the optical mode with the substrate region including a reflective surface parallel to and spaced apart from the planar layer boundary associated with the at least two regenerative semiconductor gain elements;

at least one optical entrance/exit surface of the chip to couple light into the chip in a zigzag path via a sequence of reflections between the reflective surface of the substrate region and the distributed Bragg reflectors of each regenerative semiconductor gain element with the zigzag path further having an antinode at the gain region of each regenerative semiconductor gain element;

at least one external optical element to form an external cavity providing optical feedback back into the chip and to control transverse optical mode characteristics of the optical mode to form an output beam having a fundamental Gaussian spatial mode;

the sequence of reflections on the reflective surface providing polarization discrimination to generate a linear polarization;

the zigzag path through the regenerative semiconductor gain elements substantially canceling the effects of thermal lensing within individual regenerative semiconductor gain elements;

each individual regenerative gain element lacking sufficient gain and feedback to operate as an individual laser with the lasing mode operating from the cumulative gain of the regenerative semiconductor gain elements.

18. The laser of claim 17, farther comprising an intra-cavity frequency doubler.

19. A Short wavelength semiconductor zigzag external cavity surface emitting laser, comprising:

a chip having a sequence of layers of materials;

the chip including at least two electrically pumped regenerative semiconductor gain elements disposed proximate a planar layer boundary; each individual regenerative semiconductor gain element having a p-n junction mesa to provide current confinement and spatial mode control, an active gain region formed from a GaN based material to provide gain at a preselected wavelength in the range of 0.3-0.5 µm emission wavelength, and at least one distributed Bragg reflector, each regenerative semiconductor gain element having a mesa diameter, d with a separation distance, S, between each neighboring regenerative semiconductor gain element selected such that a fill factor defined by d divided by S is less than 0.5 and with d being at least five microns;

the chip including a substrate layer region having at least one layer selected from the group consisting of sapphire or a GaN based compound, the substrate layer region being substantially transparent at a wavelength of the optical, mode and including a reflective surface parallel to and spaced apart from the planar boundary of the at least two regenerative semiconductor gain elements;

at least one optical entrance/exit surface of the chip to couple light into the chip in a zigzag path via a sequence of reflections between the reflective surface of the substrate region and the distributed Bragg reflectors of each regenerative semiconductor gain element with the zigzag path further having an antinode at the gain region of each regenerative semiconductor gain element;

at least one external optical element to form an external cavity providing optical feedback back into the chip and to control transverse optical mode characteristics of the optical mode to form an output beam having a fundamental Gaussian spatial mode;

the sequence of reflections on the reflective surface providing polarization discrimination to generate a linear polarization;

the zigzag path through the regenerative semiconductor gain elements substantially canceling the effects of thermal lensing within individual regenerative semiconductor gain elements;

each individual regenerative semiconductor gain element lacking sufficient gain and feedback to operate as an individual laser with the lasing mode operating from the cumulative gain of the regenerative semiconductor gain elements.

20. The laser of claim 19, wherein at least one of the regenerative semiconductor gain elements is operable as a forward biased p-n junction to provide optical gain and at least one of the regenerative semiconductor gain elements operable as a reverse-biased p-n junction to modulate the loss of the laser as a gain switched or mode-locked laser.

21. The laser of claim 20, further in combination with a frequency doubler.

* * * * *